United States Patent
Kawaguchi et al.

(10) Patent No.: US 7,141,517 B2
(45) Date of Patent: Nov. 28, 2006

(54) METHOD OF REPAIRING AND APPARATUS FOR REPAIRING MULTI-COLOR ORGANIC LIGHT-EMITTING DISPLAY DEVICE

(75) Inventors: Koji Kawaguchi, Nagano (JP); Makoto Kobayashi, Nagano (JP); Kenya Sakurai, Nagano (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 16 days.

(21) Appl. No.: 10/879,490

(22) Filed: Jun. 30, 2004

(65) Prior Publication Data

US 2005/0023523 A1    Feb. 3, 2005

(30) Foreign Application Priority Data

Jul. 4, 2003    (JP)    ............... 2003-271172

(51) Int. Cl.
    *H01L 21/26*    (2006.01)
(52) U.S. Cl. ............... 438/795; 257/59; 257/E21.134; 257/E27.131; 438/455; 438/487
(58) Field of Classification Search .......... 438/795
    See application file for complete search history.

(56) References Cited

U.S. PATENT DOCUMENTS 5,017,755 A * 5/1991 Yahagi et al. .......... 219/121.68
6,909,111 B1 * 6/2005 Yamagata et al. ............ 257/59
2003/0211714 A1 * 11/2003 Yamazaki et al. .......... 438/487

FOREIGN PATENT DOCUMENTS

| JP | 05-340905 | 12/1993 |
|---|---|---|
| JP | 2000-195677 | 7/2000 |
| JP | 2000-208252 | 7/2000 |
| JP | 2001-118684 | 4/2001 |
| JP | 2002-260857 | 9/2002 |

* cited by examiner

Primary Examiner—Douglas W. Owens
Assistant Examiner—Dao H. Nguyen
(74) Attorney, Agent, or Firm—Rabin & Berdo, PC

(57) ABSTRACT

A method and an apparatus for repairing short circuits between electrodes of a multi-color organic light-emitting display device. A multi-color organic light-emitting display device having a color-converting filter section is provided. Then a short-circuited part between electrodes in the device is eliminated by irradiating the short-circuited part with a laser beam. The laser irradiation is carried out from the side of the device on which the color-converting filter section is not present. The method is carried out in an environment in which the moisture content is below a certain threshold value such as a vacuum or a dry nitrogen atmosphere.

7 Claims, 4 Drawing Sheets

METHOD OF REPAIRING AND APPARATUS FOR REPAIRING MULTI-COLOR ORGANIC LIGHT-EMITTING DISPLAY DEVICE

BACKGROUND OF THE INVENTION

1. Field of the Invention

The invention relates to a method and a repair apparatus for repairing short circuits between first electrodes and one or more second electrodes of a multi-color organic light-emitting display device containing a color-converting filter section. The invention can be used in the field of multi-color organic light-emitting display devices having color-converting filters.

2. Prior Art

Organic light-emitting devices have characteristics that low-voltage driving is possible and visibility is good due to being self-luminescent, and hence research into making organic light-emitting devices fit for practical use has been carried out vigorously (see Appl. Phys. Lett., 51, 913 (1987)). As such organic light-emitting devices, ones that comprise a substrate, first electrodes, an organic light-emitting layer comprising a hole injection layer, a hole transport layer, a light-emitting layer, an electron transport layer and an electron injection layer or the like, and one or more second electrodes are known, both in the case of an active matrix driving type (one second electrode) and in the case of a passive matrix driving type (plural second electrodes).

With such an organic light-emitting device, defects caused by short-circuiting between the first electrodes and the second electrode or electrodes may occur. The occurrence of such defects is a large factor in the yield being reduced.

Pixels where there is an electrical short circuit will not light up due to the inter-electrode potential required for light emission no longer being obtained, and hence these pixels will become display defects, that is, black spots in the display. Moreover, these pixels cause various other image quality defects when displaying an image. For example, well-known such image quality defects are a data line including a short-circuited pixel being lit continuously in the form of a bright line, the whole of an address line containing a short-circuited pixel becoming dark, and so on.

Methods for repairing such short circuits between such first and second electrodes include, for example, a method in which repair is carried out by partially destroying the short-circuited electrodes using a laser (a laser-based repair method) (see, for example, Japanese Patent Application Laid-open No. 2002-260857, Japanese Patent Application Laid-open No. 2001-118684, Japanese Patent Application Laid-open No. 2000-208252, Japanese Patent Application Laid-open No. 2000-195677, and Japanese Patent Application Laid-open No. H5-340905). All of these patent documents disclose the repair of an organic light-emitting display device that does not have color-converting filters using a laser-based repair method.

In recent years, the development of multi-color organic light-emitting display devices in which color-converting filters are added as constituent elements to an organic light-emitting device as described above, has been carried out vigorously. With multi-color organic light-emitting display devices having color-converting filters, again reduction in image quality due to short-circuiting between electrodes in the organic light-emitting device section has been a problem. Such short-circuiting between electrodes may have to be repaired in a state in which the color-converting filters have already been provided on the multi-color organic light-emitting display device.

Repairing short circuits between first electrodes and one or more second electrodes of multi-color organic light-emitting display devices is important for preventing a drop in yield. However, there is a problem in the case of applying the laser-based repair method to a multi-color organic light-emitting display device. That is, because the multi-color organic light-emitting display device has color-converting filters, the laser irradiation cannot be carried out from the side where they are present. This is due to the fact that if the laser-based repair method is used to repair short-circuiting between electrodes in a multi-color organic light-emitting display device having color-converting filters from the side of the color-converting filters, the laser irradiation will damage a passivation layer or color-converting filter layers in the color-converting filter section. In particular, there is a problem that if the passivation layer is damaged, then moisture contained in the color-converting filter layers will diffuse out, and damage the organic light-emitting device, resulting in dark spots. This problem is particularly marked, for example, with a bottom emission type, passive matrix type, multi-color organic light-emitting display device in which the organic light-emitting layer is formed after the color-converting filters have been formed. Furthermore, with a multi-color organic light-emitting display device of this type, if it is decided to carry out the laser irradiation from the side of the organic light-emitting layer, i.e. the side opposite to the side of the color-converting filters, after sealing has been carried out, then there will be a problem that the choice of sealing member, drying agent and so on will be restricted. Moreover, there are calls for a repair method having a broad range of application that can also be applied to multi-color organic light-emitting display devices of other types.

OBJECTS AND SUMMARY OF THE INVENTION

It is therefore an object of the invention to provide a general-purpose method for repairing short circuits between first electrodes and one or more second electrodes of a multi-color organic light-emitting display device. It is also an object of the invention to provide a laser-based repair apparatus that can be used in such a repair method.

A method of repairing a short-circuited part between electrodes in a multi-color organic light-emitting display device of the invention includes (1) a step of providing a multi-color organic light-emitting display device having a color-converting filter section, and (2) a step of detecting a short-circuited part between electrodes in the device, and eliminating the short-circuited part by irradiating the short-circuited part with a laser, wherein the laser irradiation is carried out from the side of the device on which the color-converting filter section is not present. With the short-circuited part repair method of the invention, preferably the multi-color organic light-emitting display device has yet to be sealed and the step of eliminating the short-circuited part is carried out in a vacuum or in a dry nitrogen atmosphere.

The invention also includes a repair apparatus for repairing a short-circuited part between electrodes in a multi-color organic light-emitting display device. Such an apparatus has a color-converting filter section and an organic light-emitting device. This apparatus includes at least a means for detecting a short-circuited part from a color-converting filter section side, or from the color-converting filter section side and an organic light-emitting device side. Also included are a positioning means, a lighting means for carrying out lighting of the multi-color organic light-emitting display device, and a laser irradiation apparatus. The apparatus is arranged so that the laser irradiation apparatus irradiates from the side of the multi-color organic light-emitting display device on which the color-converting filter section is not present. The repair apparatus of the invention preferably further includes a means that enables the repair of the short-circuited part to be carried out in a dry environment.

The method of repairing short-circuited electrode parts according to the invention is a general-purpose method for repairing short circuits between first electrodes and one or more second electrodes of a multi-color organic light-emitting display device. The method can be carried out in a moisture-free environment such as a vacuum or a dry nitrogen-purged atmosphere, and hence the repair of short-circuited electrode parts can be carried out at a stage when the multi-color organic light-emitting display device has not yet been sealed. Furthermore, with the short-circuited part repair method of the invention, there is no damage to color-converting filter layers, and hence dark spots will not arise for a prolonged period.

Moreover, the repair apparatus for repairing a short-circuited part between electrodes of the invention is a general-purpose apparatus for repairing short circuits between first electrodes and one or more second electrodes of a multi-color organic light-emitting display device. It enables the repair of short-circuited electrode parts to be carried out at a stage when the multi-color organic light-emitting display device has not yet been sealed.

DETAILED DESCRIPTION OF THE PREFERRED EMBODIMENTS

Figure 1A:
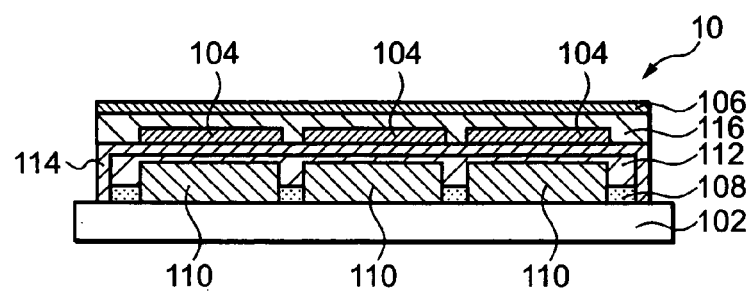
FIGS. 1(a) to 1(d) are drawings showing examples of multi-color organic light-emitting display devices to which a short-circuited part repair method of the invention can be applied.

A first aspect of the invention relates to a method of repairing short circuits between first electrodes and second electrode(s) of a multi-color organic light-emitting display device comprising a color-converting filter section and an organic light-emitting device. A second aspect of the invention relates to a repair apparatus (hereinafter also referred to as a 'laser-based repair apparatus') used in the method of repairing short circuits between electrodes of the invention.

Following is a description of the first and second aspects of the invention.

The method of the invention is a method of repairing a short-circuited part between electrodes in a multi-color organic light-emitting display device. The method includes (1) a step of providing a multi-color organic light-emitting display device having a color-converting filter section, and (2) a step of detecting a short-circuited part between electrodes in the device, and eliminating the short-circuited part by irradiating the part with a laser. The laser irradiation is carried out from the side of the device on which the color-converting filter section is not present. The laser repair preferably is carried out in an environment in which the moisture content is below a certain threshold value, such as a vacuum or a nitrogen-purged atmosphere. Following is a description of the two steps. Note that in the description of the second step, a description also will be given of the laser-based repair apparatus of the invention.

In the first step, an organic light-emitting display device having a color-converting filter section (also referred to as a 'multi-color organic light-emitting display device') is provided. In the present specification, an 'organic light-emitting display device having a color-converting filter section' or a 'multi-color organic light-emitting display device' means an organic light-emitting display device having at least a color-converting filter section and an organic light-emitting device, with the definition including both devices that have yet to be sealed and ones that have already been sealed. In the present specification, the 'color-converting filter section' contains color-converting filter layers, and may also contain a transparent substrate, a black matrix, a flattening layer, a passivation layer and so on. 'Color-converting filter layer' is a generic term for a color filter layer, a color-converting layer, or a laminate of a color filter layer and a color-converting layer. A 'color-converting layer' is a layer that subjects light emitted from the organic light-emitting layer to wavelength distribution conversion and emits light of a different wavelength. A 'color filter layer' is a layer that does not carry out wavelength distribution conversion, but rather merely transmits only light in a specific wavelength region. Moreover, 'organic light-emitting device' means an organic electroluminescent device that comprises at least first electrodes, an organic light-emitting layer and at least one second electrode. As the organic light-emitting device, one that emits light of any color can be used, for example a device that emits light in the blue or blue/green region or white light can be used. Regarding the combination of the color-converting filter section and the organic light-emitting device, for example in the case of an organic light-emitting device that emits light in the blue or blue/green region, this device may be used in combination with blue color filter layers, green color-converting filter layers that convert the light emitted from the organic light-emitting device into light in the green region using fluorescent colorant(s), and red color-converting filter layers that convert the light emitted from the organic light-emitting device into light in the red region using fluorescent colorant(s). Moreover, in the case of using an organic light-emitting device that emits white light, this device may be used in combination with blue, green and red color filter layers.

In the invention, the organic light-emitting display device may be of either a bottom emission type or a top emission type, and may have any of various different forms. For example, the device may have a form in which the color-converting filter section is built up on the organic light-emitting device, or a form in which the color-converting filter section and the organic light-emitting device are bonded together. Moreover, the multi-color organic light-emitting display device may be of a passive matrix type or a TFT type. In the invention, the color-converting filter section and the organic light-emitting device of the multi-color organic light-emitting display device may further contain a flattening layer, a passivation layer and so on.

Figure 1B:
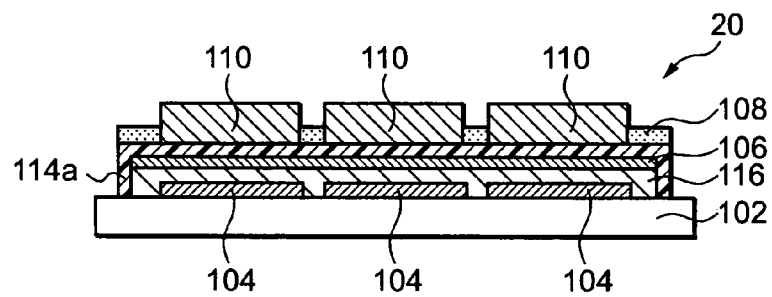
Figure 1C:
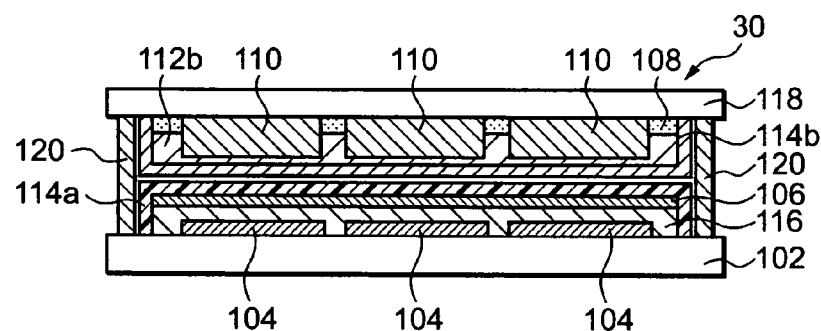
Figure 1D:
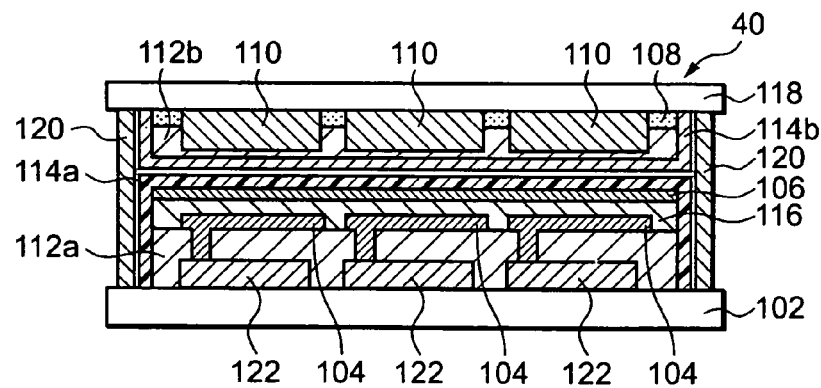

Specific examples include a bottom emission type, built-up type passive matrix type, multi-color organic light-emitting display device 10, as shown in FIG. 1(a). Another example is a top emission type, built-up type, passive matrix type, multi-color organic light-emitting display device 20, as shown in FIG. 1(b). A further example is a top emission type, bonded type, passive matrix type, multi-color organic light-emitting display device 30, as shown in FIG. 1(c). Also, there is a TFT type, multi-color organic light-emitting display device 40, as shown in FIG. 1(d). If the multi-color organic light-emitting display device provided in the present step is of a built-up type, then the multi-color organic light-emitting display device may be in an as yet unsealed state as shown in FIGS. 1(a) and 1(b). Note that for the sake of simplicity, in FIGS. 1(a) and 1(b) each multi-color organic light-emitting display device has been shown as having only one pixel, but the multi-color organic light-emitting display device may of course have a plurality of pixels.

Following is an outline description of a method of manufacturing each multi-color organic light-emitting display device. A first embodiment is the bottom emission type, built-up type, passive matrix type multi-color organic light-emitting display device 10 of FIG. 1(a). First, a description will be given of a method of manufacturing the display device of FIG. 1(a). In the following description, the case that first electrodes 104 are anodes and second electrodes 106 are cathodes is taken as an example. In the manufacturing method, first a black matrix 108 is formed in a pattern on a transparent supporting substrate 102, and color-converting filter layers 110 are formed on the supporting substrate 102. In this first embodiment, as the supporting substrate 102, for example an insulating substrate made of glass, plastic or the like can be used. Alternatively, a polymer film may be used as the supporting substrate 102. The materials and so on for the other layers may be those conventionally used.

A specific manufacturing method would be as follows. For example a black inorganic layer, a layer comprising a resin having a black dye or a black pigment dispersed therein or the like can be formed, for example, on a transparent substrate made of a glass made by Corning using a dry process such as sputtering, CVD or vacuum deposition. Alternative to a dry process, a wet process such as spin coating may be used. Then, patterning can be carried out using photolithography or the like, whereby the black matrix 108 can be formed. Next, matrix resins containing dyes or pigments are applied by spin coating or the like onto the transparent supporting substrate 102 on which the black matrix 108 has been formed, and patterning is carried out using photolithography or the like, whereby the color-converting filter layers 110 are formed. Conventional conditions for film formation may be used.

In the present embodiment, next a flattening layer 112 and, if needed, a passivation layer 114, are formed. For example, a material for forming the flattening layer 112 is applied by spin coating or the like onto the color-converting filter layers. Then baking is carried out using a heating means, such as an oven. In the case of applying the color-converting filter layers onto the organic light-emitting device, or the color-converting filter layers otherwise coming into contact with the organic light-emitting device, the light-emitting parts may be susceptible to moisture, alkalis or the like. In such a case, a passivation layer 114 for sealing up and protecting the various elements therebelow is provided. The passivation layer 114 can be formed by sputtering or the like. The materials and thicknesses of the flattening layer and the passivation layer, the film formation conditions and so on may be those conventionally used.

Moreover, each matrix resin used in the color-converting filter layers comprises, for example, a light-curable resin or a joint-light/heat-curable resin. This resin is subjected to a light and/or heat treatment so as to generate radical species or ionic species, thereby polymerizing or crosslinking the resin, which makes the resin insoluble and unmeltable, whereby the color-converting filter layers are formed.

Next, a description will be given of the manufacture of the first electrodes 104, the organic light-emitting layer 116 and the second electrodes 106.

A transparent layer is formed over the whole of an upper surface of the passivation layer by sputtering or the like. A resist agent is applied to the transparent layer. Then patterning is carried out using photolithography or the like so as to obtain from the transparent layer a striped pattern of first electrodes (anodes) 104 in positions corresponding to the light-emitting parts of the various colors.

Next, the organic light-emitting layer 116 is formed on the first electrodes 104. For the organic light-emitting layer 116, for example a hole injection layer, a hole transport layer, an organic light-emitting layer, and an electron injection layer are formed in this order using a resistive heating vapor deposition apparatus or the like without releasing the vacuum. Note that the organic light-emitting layer 116 is not limited to having this constitution, but rather any of various forms such as the following may be adopted. For each of the forms, the various layers may be obtained in the stated order using a resistive heating vapor deposition apparatus or the like.

(A) Anodes/organic light-emitting layer/cathodes;
(B) Anodes/hole injection layer/organic light-emitting layer/cathodes;
(C) Anodes/organic light-emitting layer/electron transport layer/cathodes;
(D) Anodes/hole injection layer/organic light-emitting layer/electron transport layer/cathodes;
(E) Anodes/hole injection layer/hole transport layer/organic light-emitting layer/electron transport layer/cathodes;
(F) Anodes/hole injection layer/hole transport layer/organic light-emitting layer/electron transport layer/electron injection layer/cathodes.

After that, the second electrodes (cathodes) 106 are formed without releasing the vacuum, using a mask such as to obtain a pattern of strips (striped pattern) perpendicular to the strips of the first electrodes.

Materials of the first electrodes, the organic light-emitting layer and the second electrodes may be selected from those known in the art. For example, transparent electrodes made of indium-tin oxide (ITO), indium-zinc oxide (IZO) or the like can be used as the first electrodes (anodes). For the second electrodes (cathodes), any of the following can be used: an electron-injecting metal selected from alkali metals such as lithium, sodium and potassium, and alkaline earth metals such as calcium, magnesium and strontium, a fluoride or the like thereof, an alloy thereof with other metals, or a compound thereof. Other conditions, such as the film thicknesses for the first electrodes, the organic light-emitting layer and the second electrodes, may be conventional.

The multi-color organic light-emitting device obtained is subjected to the laser-based repair step (2). According to the laser-based repair method of the present embodiment the multi-color organic light-emitting display device can be subjected to the repair step (2) without being sealed. The sealing thus can be carried out after short circuits between electrodes have been repaired. The scope of selection of the sealing member and so on thus is broadened.

Next, a description will be given of a method of manufacturing the multi-color organic light-emitting display device 20 of a second embodiment. The second embodiment relates to a method of manufacturing the top emission type, built-up type, passive matrix type multi-color organic light-emitting display device 20 shown in FIG. 1(*b*).

In the second embodiment, an organic light-emitting device is formed by providing first electrodes 104, an organic light-emitting layer 116, second electrodes 106, and a passivation layer 114*a* on a supporting substrate 102, and then forming color-converting filter layers thereon. For the organic light-emitting device, the first electrodes, the organic light-emitting layer and the second electrodes may be formed on the supporting substrate 102 following a conventional procedure. After the second electrodes have been formed, the passivation layer 114*a* is further formed following a conventional procedure.

Next, a black matrix 108 and color-converting filter layers 110 are formed on the passivation layer 114*a* using a combination of spin coating and photolithography. Conventional methods may be used for forming the passivation layer and the color-converting filter layers. The multi-color organic light-emitting device obtained is subjected to the laser-based repair step (2).

Note that in the second embodiment, a conventional supporting substrate 102 can be used so long as this substrate is transparent to the laser light. For example, a glass substrate, a thin polymer film or the like that is transparent to the laser light can be used.

As stated above with respect to both the first embodiment and the second embodiment, the multi-color organic light-emitting display device is subjected to step (2) before sealing is carried out. However, in the present invention, the multi-color organic light-emitting display device alternatively may be subjected to step (2) after having been sealed using, for example, an outer periphery sealing agent and a sealing member or the like. In this case, the sealing should be carried out with materials that will not hinder the repair using the laser-based repair apparatus.

Next, a description will be given of a method of manufacturing a multi-color organic light-emitting display device of a third embodiment. The third embodiment relates to a method of manufacturing the top emission type, bonded type, multi-color organic light-emitting display device 30 or 40 shown in FIG. 1(*c*) or 1(*d*). The present embodiment encompasses both passive matrix type (FIG. 1(*c*)) and the TFT-type (FIG. 1(*d*)) multi-color organic light-emitting display devices.

In the third embodiment, in the case of the passive matrix type, first electrodes 104, an organic light-emitting layer 116 and one or more second electrodes 106 are formed on a supporting substrate 102. Moreover, in the case of the TFT type, TFTs 122 are formed on a supporting substrate 102, a flattening layer 112*a* is formed thereon, and then first electrodes 104, organic light-emitting layer 116 and one or more second electrodes 106 are formed thereon. The procedure for providing the organic light-emitting layer 116 on the supporting substrate or the flattening layer is conventional. Note that in the third embodiment, a conventional supporting substrate 102 can be used so long as this substrate is transparent to the laser light used in the repair carried out with the laser-based repair apparatus, described later. For example, a glass substrate, a thin polymer film or the like that is transparent to the laser light can be used.

After the one or more second electrodes 106 has/have been provided, a passivation layer 114*a* is provided following a conventional procedure. Next, for example a black matrix 108 and color-converting filter layers 110 are formed on a transparent substrate 118 using a combination of spin coating and photolithography, and then a flattening layer 112*b* and a passivation layer 114*b* are formed, whereby a color-converting filter section is manufactured. Next, the organic light-emitting device and the color-converting filter section that have been formed as described above are bonded together and sealed using an outer periphery sealing layer 120 made of a UV-curing adhesive or the like. The multi-color organic light-emitting device obtained is subjected to the laser repair step (2).

Any of various multi-color organic light-emitting display devices can be manufactured as described above, but the above manufacturing methods are examples, and any of various constituent elements that have been publicly known can be added so long as the electrode short circuit repair carried out using the laser-based repair apparatus, described later, is not hindered.

Next, a description will be given of (2).

In step (2), a multi-color organic light-emitting display device manufactured in step (1) is illuminated, short-circuited parts between electrodes are detected, and the short-circuited parts are repaired by irradiating with a laser. In the invention, the laser irradiation must be carried out from the side of the multi-color organic light-emitting display device on which the color-converting filter section is not present. Moreover, the short-circuited part laser-based repair method of the invention can be carried out in an environment from which moisture has been removed, such as a vacuum or a dry $N_2$-purged atmosphere, and therefore the repair of the short-circuited electrode parts can be carried out at a stage before the multi-color organic light-emitting display device has been sealed. This feature is particularly effective with the multi-color organic light-emitting display device of the first embodiment described above. No damage will occur to the color-converting filter section, in particular the passivation layer, and moreover the sealing member, drying agent and so on can be freely selected.

Figure 2:
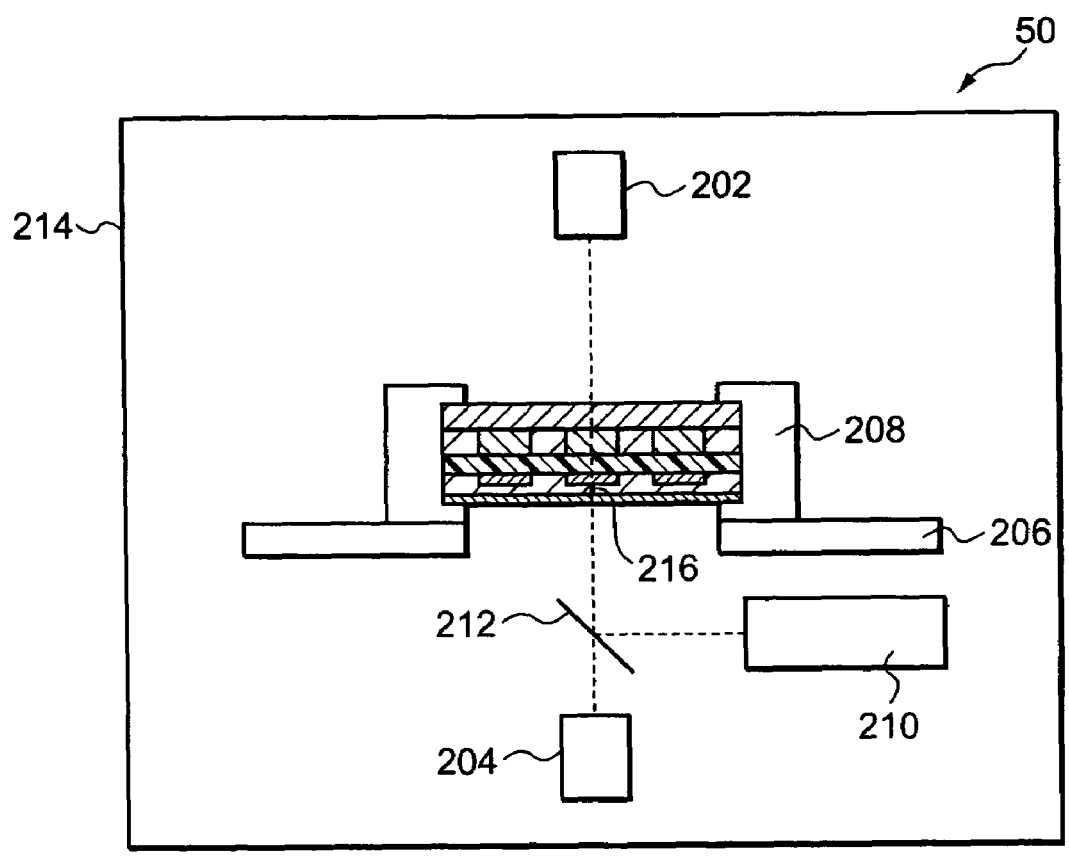
FIG. 2 is a schematic drawing showing an example of a laser-based repair apparatus of the invention.

First, a description will be given of a repair apparatus that can be used in performing in the method of repairing defects according to the invention. In the following description, the drawings are referred to as appropriate, but the apparatus shown in the drawings is merely an example, and the present invention is not limited thereto. FIG. 2 shows a repair apparatus of the present invention, and shows a state in which the multi-color organic light-emitting display device 10 used in performing the first embodiment of step (1) as described above, has been set in the apparatus. The multi-color organic light-emitting display device 10 has a short-circuited part 216 between a first electrode and a second electrode.

As shown in FIG. 2, the laser-based repair apparatus 50 used in the invention has at least a short-circuited part detecting apparatus such as would include light detecting elements 202 and 204, for detecting short-circuited parts from the color-converting filter section side, or the color-converting filter section side and the organic light-emitting device side, a positioning device 206 for moving the multi-color organic light-emitting display device to a prescribed position, a lighting structure 208 that illuminates the multi-color organic light-emitting display device, and a laser irradiation apparatus 210. The laser irradiation can be carried out from the side of the multi-color organic light-emitting display device on which the color-converting filter section is not present. Furthermore, the laser-based repair apparatus of the invention is equipped with a dry environment means 214, including an enclosure, and otherwise to provide a dry environment, for enabling the repair of the short-circuited parts to be carried out in an environment in which the moisture content is below a certain threshold value, such as would be present in a vacuum or a nitrogen-purged atmosphere. Moreover, the laser-based repair apparatus of the invention may have a half mirror 212, a control mechanism for, for example, supplying electrical power to the lighting apparatus 208 and controlling the lighting apparatus 208, image processing means for processing images obtained from the short-circuited part detecting means 202 and 204, a control mechanism for controlling the above constitution, a condensing lens, a shutter, and so on.

In the above apparatus, the short-circuited part detecting means 202 and 204 are means able to detect the sites of short circuits in the lit multi-color organic light-emitting display device; examples are emission microscopes, CCDs, and the like. The positioning means 206 is a means able to move the multi-color organic light-emitting display device in three dimensions; examples are an XYZ stage, and the like. The positioning means 206 positions the multi-color organic light-emitting display device in a suitable position when detecting the short-circuited parts, carrying out the laser irradiation, and so on. The lighting means 208 lights the multi-color organic light-emitting display device when detecting the short-circuited parts, and is selected as appropriate in accordance with the multi-color organic light-emitting display devices that may be used with the invention. The laser irradiation apparatus 210 irradiates a laser beam onto the short-circuited parts; in the invention, a YAG laser, a dye laser or the like can be used. In particular, in the case of processing transparent electrodes or metal electrodes with the present invention, the third harmonic of a YAG laser (355 nm) is suitable. With the present embodiment, the laser-based repair apparatus has a dry environment means 214 that enables the inside of the apparatus to be put under a vacuum or a dry nitrogen atmosphere; publicly known means such as a vacuum chamber or a glove box can be used as this dry environment means 214. With this apparatus of the invention, a means that enables the moisture content to be made less than 1 ppm is used.

Moreover, the laser-based repair apparatus of the invention may include an automating system. Such a system would carry out the lighting of the multi-color organic light-emitting display device, the detection of the short-circuited parts, and the repair of the short-circuited parts with the laser automatically.

By using such an apparatus, short circuits between electrodes can be repaired without damaging the passivation layer or the color-converting filter layers. In particular, with the apparatus of the invention, because the laser irradiation is carried out from the side of the multi-color organic light-emitting display device on which the color-converting filter section is not present, there is no damage to the passivation layer. Damage to the organic light-emitting device due to moisture or the like contained in the color-converting filter layers, and the occurrence of dark spots due to such damage thus can be prevented.

With the method of repairing short-circuited parts between electrodes of the invention, the short-circuited parts between electrodes are eliminated with a laser using a laser-based repair apparatus as described above.

Figure 3A:
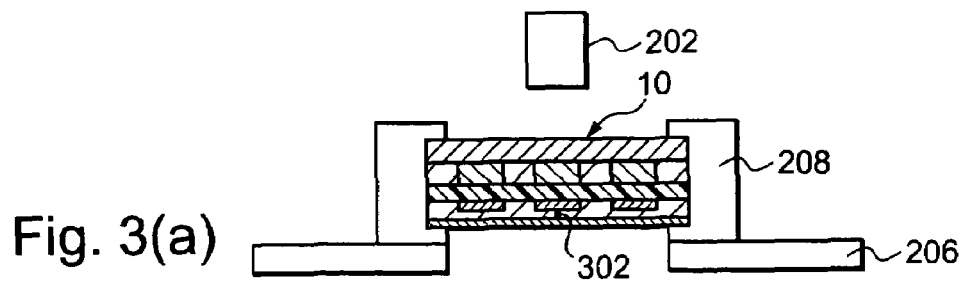
FIGS. 3(a) to 3(c) are drawings for explaining a short-circuited part laser-based repair method of the invention.
Figure 3B:
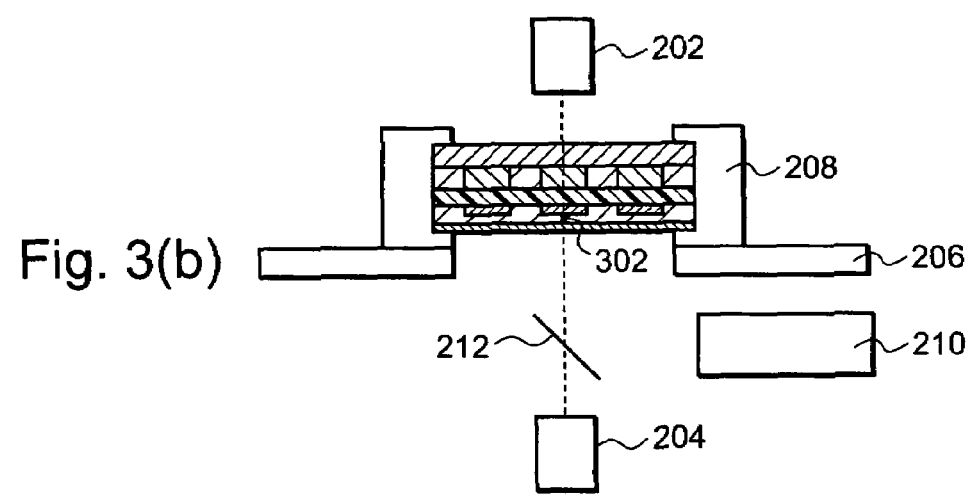
Figure 3C:
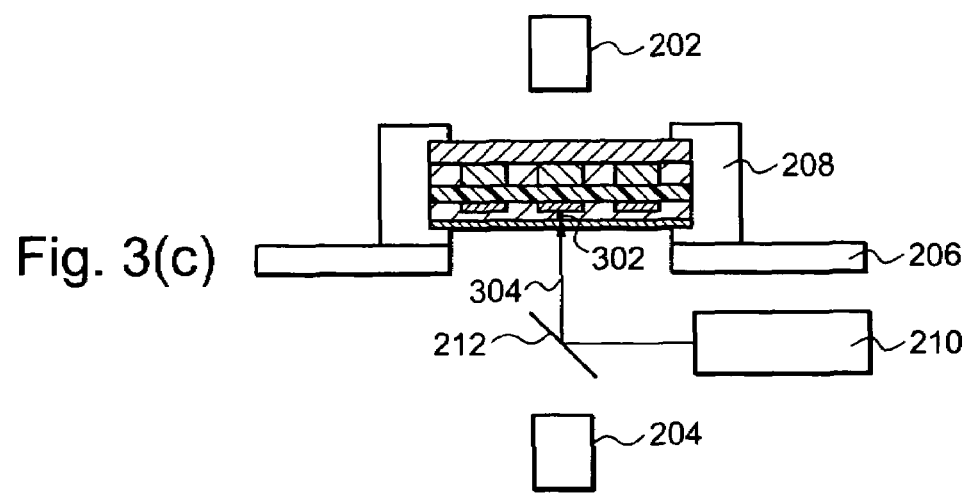

Following is a description of the method of repairing short-circuited parts between electrodes using the laser-based repair apparatus described above, with reference to FIGS. 3(a)–3(c). FIGS. 3(a)–3(c) show an example in which a short-circuited part of a multi-color organic light-emitting display device 10, as manufactured in the first embodiment described earlier, is repaired. Note that in FIGS. 3(a)–3(c), the multi-color organic light-emitting display device has been shown as having only one pixel to simplify the explanation, but the multi-color organic light-emitting display device may of course have a plurality of pixels.

The multi-color organic light-emitting display device 10 is installed on the lighting means 208. The lighting means 208 holding the device 10 is in turn on the positioning means 206, which is an XYZ stage or the like. The multi-color organic light-emitting display device 10 here shall be assumed to have a short-circuited part 302. In the invention, the multi-color organic light-emitting display device is installed such that the color-converting filter section side of the multi-color organic light-emitting display device is on the opposite side to the laser irradiation apparatus 210 (FIG. 3(a)). Moreover, the laser-based repair apparatus is made for use in an environment in which the moisture content is below a prescribed threshold value (e.g. 1 ppm). By carrying out the repair under such conditions, the short-circuited parts between electrodes can be repaired without sealing the multi-color organic light-emitting display device. Thus, compared with the case that the short-circuited parts between electrodes are repaired after the sealing, there is more freedom in the selection of the sealing member, the drying agent and so on for the multi-color organic light-emitting display device. Moreover, damage to the color-converting filter section by the laser beam can be avoided.

Next, the lighting means 208 is operated to illuminate the multi-color organic light-emitting display device 10. Then, the positioning means 206 is driven, and an inspection for short-circuited parts in the multi-color organic light-emitting display device 10 is carried out using the short-circuited part detector elements 202, 204 (See FIG. 3(b)). With this embodiment of the invention, the inspection for short-circuited parts may be carried out using both of the short-circuited part detecting elements 202, 204, or may be carried out using only one of the two detector elements, namely detector element 202 on the color-converting filter section side.

When a short-circuited part 302 is detected, a laser beam is output from the laser irradiation apparatus 210, thus breaking and hence insulating the short-circuited part 302 (FIG. 3(c)). As shown in FIG. 3(c), the laser light beam 304 is radiated, for example via a half mirror 212, onto the side of the multi-color organic light-emitting display device on which the color-converting filter section is not present. In a case that a plurality of short-circuited parts exist, the laser irradiation should be repeated for each short-circuited part, thus insulating the short-circuited parts between electrodes.

As mentioned earlier, as the laser source, a dye laser, a YAG laser or the like can be used. If the electrodes of the multi-color organic light-emitting display device are transparent electrodes or metal electrodes in particular, they are suitably to be processed by the third harmonic of a YAG laser (355 nm).

Note that the inspection for and repair of the short-circuited parts may each be carried out at once for all of the pixels of the multi-color organic light-emitting display device 10, or may be carried out one line or one pixel at a time. Moreover, a method has been described above in which the short-circuited parts between electrodes are repaired using the laser-based repair method before sealing the multi-color organic light-emitting display device. However, the repair of the multi-color organic light-emitting display device may alternatively be carried out after the sealing. In that case, the laser light must be radiated from the sealing member side, and hence the sealing member and other materials present on the second electrode side are required to be transparent to the laser light used.

Figure 4A:
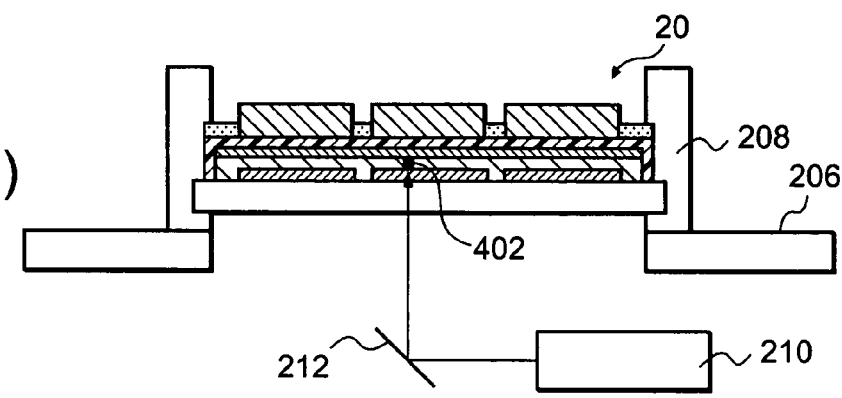
FIGS. 4(a) to 4(c) are drawings for explaining a short-circuited part laser-based repair method of the invention.
Figure 4B:
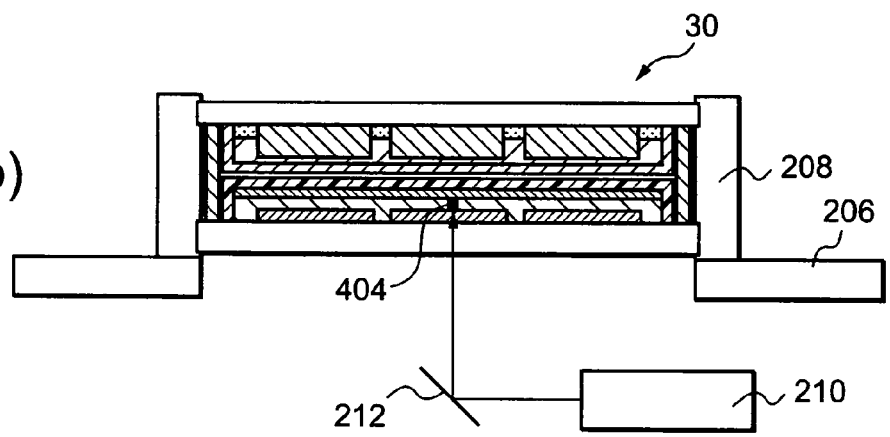
Figure 4C:
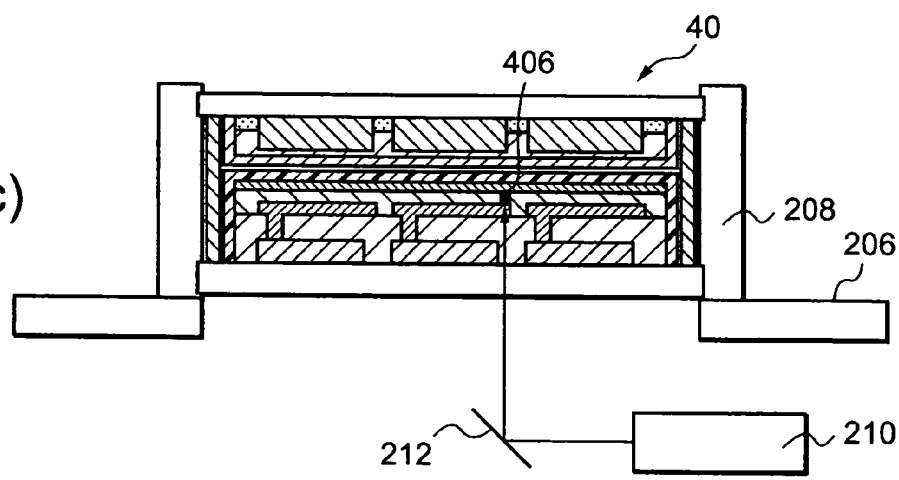

With step (2) of the method of the invention, repair may be accomplished of not only the multi-color organic light-emitting display device 10, but also of the multi-color organic light-emitting display devices 20, 30 and 40 of the various other types described earlier. The procedures for repair of such multi-color organic light-emitting display devices 20, 30 and 40 are shown in FIGS. 4(*a*), 4(*b*) and 4(*c*), respectively. In FIGS. 4(*a*), 4(*b*) and 4(*c*), the short-circuited part detecting elements 202 and 204 have been omitted from the drawing. FIGS. 4(*a*), 4(*b*) and 4(*c*) are schematic drawings for the cases of carrying out repair of short-circuited parts between electrodes for the multi-color organic light-emitting display devices 20, 30 and 40 respectively.

In the case of carrying out repair on the multi-color organic light-emitting display device 20 of the second embodiment described earlier, as with the multi-color organic light-emitting display device 10, the laser light should be irradiated from the side of the multi-color organic light-emitting display device on which the color-converting filter section is not present, as shown in FIG. 4(*a*), under an environment in which the moisture content is below a certain threshold value. In FIG. 4(*a*), a short-circuited part is indicated by reference numeral 402. The procedure and so on for the inspection for short-circuited parts and the laser irradiation are as for the multi-color organic light-emitting display device 10. Note that in the present case of the multi-color organic light-emitting display device 20, the supporting substrate 102 on which the organic light-emitting device is formed is required to be transparent to the laser light. In FIG. 4(*a*), an example in which the short-circuited parts between electrodes are repaired through the laser irradiation before sealing is shown, but as with repair the multi-color organic light-emitting display device 10, the short-circuited parts between electrodes may alternatively be repaired after the sealing.

Moreover, as shown in FIG. 4(*b*) and FIG. 4(*c*), repair of short-circuited parts using the laser-based repair method can be carried out similarly as well for a multi-color organic light-emitting display device 30 or 40 of the third embodiment described earlier. In FIG. 4(*b*) and FIG. 4(*c*), short-circuited parts are indicated by reference numerals 404 and 406, respectively.

EXAMPLE 1

In the present example, a multi-color organic light-emitting display device 10 as shown in FIG. 1(*a*) was manufactured, and short-circuited parts between electrodes were repaired.

1) Manufacture of Color-Converting Filter Section

Formation of Black Matrix 108

A black inorganic layer or a layer comprising a resin having a black pigment or a black dye dispersed therein was applied onto a sheet of glass made by Corning (Corning 1737 glass, which is an alkali-free glass) by sputtering, spin coating or the like, and then patterning was carried out.

Formation of Blue Filter Layers

Two parts by weight of a colorant of the undermentioned structural formula (1) as a blue colorant were added to 100 parts by weight in terms of solids of a transparent photopolymerizable resin (V259PA/P5, made by Nippon Steel Chemical Co., Ltd.), and one part by weight of a second colorant (HDITCI, made by Lambda Physik) was further added. This was taken as a blue color filter coating liquid.

Formula 1

The blue color filter coating liquid was applied onto the glass substrate 102 using a spin coating method, drying was carried out by heating at 80° C., and then photolithography was used, thus forming blue color filter layers.

Formation of Green Color-Converting Filter Layers 0.7 parts by weight of Coumarin 6 as a fluorescent colorant was dissolved in 120 parts by weight of a propylene glycol monoethyl acetate (PGMEA) solvent. 100 parts by weight of the photopolymerizable resin V259PA/P5 (trade name, made by Nippon Steel Chemical Co., Ltd.) was then added to the solution and dissolved, thus obtaining a green color-converting filter coating liquid. This coating liquid was applied using a spin coating method onto the transparent substrate 102 on which the blue color-converting filter layers had already been formed, and photolithography was used, thus forming green color-converting filter layers.

Formation of Red Color-Converting Filter Layers 0.7 parts by weight of Coumarin 6, 0.3 parts by weight of Rhodamine 6G and 0.3 parts by weight of Basic Violet 11 as fluorescent colorants were dissolved in 120 parts by weight of a propylene glycol monoethyl acetate (PGMEA) solvent. 100 parts by weight of the photopolymerizable resin V259PA/P5 (trade name, made by Nippon Steel Chemical Co., Ltd.) was then added to the solution and dissolved, thus obtaining a red color-converting filter coating liquid. This coating liquid was applied using a spin coating method onto the transparent substrate 102 on which the blue color-converting filter layers and the green color-converting filter layers had already been formed, and photolithography was used, thus forming red color-converting filter layers.

Formation of Flattening Layer 112

A transparent photopolymerizable resin (V259PA/P5, made by Nippon Steel Chemical Co., Ltd.) was applied using a spin coating method onto the substrate on which the blue, green and red color-converting filter layers had been formed, and then baking was carried out in an oven at 150° C., thus obtaining a flattening layer 112.

Formation of Passivation Layer 114

A passivation layer made of $SiO_2$ was formed over the whole of the flattening layer, using a sputtering method. Thereby, a color-converting filter section of the invention was formed.

2) Manufacture of Multi-Color Organic Light-Emitting Display Device

Next, first electrodes, an organic light-emitting layer and second electrodes were formed.

Formation of First Electrodes 104

A transparent electrode material (IZO) was deposited over the whole of the passivation layer of the filter substrate. A resist agent OFPR 800 (trade name, made by Tokyo Ohka Kogyo Co., Ltd.) was applied onto the IZO, and then patterning was carried out using a photolithography method, thus forming first electrodes 104 on the color-converting filter layers. The first electrodes had a width of 100 µm and a pitch of 110 µm.

Formation of Organic Light-Emitting Layer 116 and Second Electrodes 106

The substrate on which the first electrodes had been formed as described above was put into a resistive heating vapor deposition apparatus, and a hole injection layer, a hole transport layer, a light-emitting layer and an electron injection layer were deposited in this order without releasing the vacuum, thus forming an organic light-emitting layer 116. During the deposition, the pressure inside the vacuum chamber was made to be $1 \times 10^{-4}$ Pa. For the hole injection layer, copper phthalocyanine (CuPc) was formed to a thickness of 100 nm. For the hole transport layer, 4,4'-bis[N-(1-naphthyl)-N-phenylamino]biphenyl (α-NPD) was formed to a thickness of 20 nm. For the organic light-emitting layer, 4,4'-bis(2,2'-diphenylvinyl)biphenyl (DPVBi) was formed to a thickness of 30 nm. For the electron injection layer, an aluminum chelate (Alq) was formed to a thickness of 20 nm.

After that, without releasing the vacuum, Mg/Ag (weight ratio 10:1) was deposited to a thickness of 200 nm using a mask so as to obtain second electrodes 106 in a pattern of strips of width 300 μm and pitch 330 μm perpendicular to the strips of the first electrodes (IZO).

Short-Circuited Part Elimination Step

The multi-color organic light-emitting display device obtained as described above was installed in a laser-based repair: apparatus as shown in FIG. 2. The installation was carried out such that the laser light would be irradiated from the side of the second electrodes. Next, the multi-color organic light-emitting display device 10 was illuminated. The positioning means was driven, and short-circuited parts between electrodes in the multi-color organic light-emitting display device 10 were inspected using short-circuited part detecting means comprising an emission microscope. The discovered short-circuited parts were insulated by irradiating with laser light. The third harmonic of a YAG laser (355 nm) was used as the laser light. In the invention, the optical path of the laser light can be positioned using a shutter, a condensing lens and so on if required.

Multi-Color Organic Light-Emitting Display Device Sealing Step

After the short-circuited parts between electrodes had been repaired, the multi-color organic light-emitting display device was sealed. The multi-color organic light-emitting display device was put into a dry nitrogen atmosphere in a glove box (preferably with the oxygen and moisture concentration both not more than 1 ppm). Using a dispenser robot, sealing was carried out using a sealing member and a UV-curing adhesive.

Note that in the present example, the repair of short circuits between electrodes was carried out before the sealing, but the repair of short circuits between electrodes instead may be carried out similarly after the multi-color organic light-emitting display device has been sealed. In this case, there is no need to adjust the moisture content in the laser-based repair apparatus to below a certain threshold value.

With the multi-color organic light-emitting display device repaired in the present example, even after a test, driving the device for 1000 hours, enlargement of dark spots around the repaired parts was not observed, and stable driving could be carried out.

EXAMPLE 2

In the present example 2, a multi-color organic light-emitting display device 20 as shown in FIG. 1(*b*) was manufactured. Then short-circuited parts between electrodes were repaired.

Following the procedure for forming the first electrodes, the organic light-emitting layer and the second electrodes of Example 1 above, first electrodes, an organic light-emitting layer and second electrodes were formed on a substrate transparent to laser light. Next, a passivation layer 114*a* made of $SiO_2$ was deposited over the whole surface using a sputtering method.

Following the procedure described above under the heading 'Manufacture of color-converting filter section' in Example 1, blue filter layers, green color-converting filter layers and red color-converting filter layers were formed on the passivation layer 114*a*. As in Example 1, the multi-color organic light-emitting display device 20 obtained was installed in a laser-based repair apparatus, and inspection and repair of short-circuited parts between electrodes was carried out.

Note that in the present example, the repair of short circuits between electrodes was carried out before the sealing, but the repair of short circuits between electrodes similarly may be carried out instead after the multi-color organic light-emitting display device 20 has been sealed. In this case, there is no need to adjust the moisture content in the laser-based repair apparatus to below a certain threshold value.

With the multi-color organic light-emitting display device repaired in the present example, even after a 1000-hour driving test, enlargement of dark spots around the repaired parts was not observed, and stable driving could be carried out.

EXAMPLE 3

1) Manufacture of Organic Light-Emitting Device

Following the procedure described under the heading '2) Manufacture of multi-color organic light-emitting display device' in Example 1 above, first electrodes 104, an organic light-emitting layer 116, second electrodes 106 and a passivation layer 114*a* were formed on a substrate transparent to laser light.

2) Manufacture of Color-Converting Filter Section

Following the procedure described in Example 1 above under the heading 'Manufacture of color-converting filter section', a black matrix, blue filter layers, green color-converting filter layers, red color-converting filter layers, a flattening layer and a passivation layer were formed on a sheet of glass made by Corning (Corning 1737 glass, which is an alkali-free glass).

3) Bonding Step

The organic light-emitting device and the color-converting filter section obtained were bonded together and sealed using a UV-curing adhesive 120 in a dry nitrogen atmosphere in a glove box (oxygen and moisture concentration both not more than 1 ppm). As in Example 1, the multi-color organic light-emitting display device 30 obtained was installed in a laser-based repair apparatus, and inspection and repair of short-circuited parts between electrodes were carried out.

Note that in the present example, a passive matrix-type multi-color organic light-emitting display device is described. However, the repair of short circuits between electrodes may be carried out similarly on a TFT-type multi-color organic light-emitting display device 40 in which TFTs are formed on the supporting substrate.

With the multi-color organic light-emitting display device repaired in the present example, even after driving it for 1000 hours as a test, enlargement of dark spots around the repaired parts was not observed, and stable driving could be carried out.

COMPARATIVE EXAMPLE 1

Electrode repair was carried out on a multi-color organic light-emitting display device 10 that had been manufactured as far as the second electrodes as in Example 1. The procedure was as in Example 1, except that the laser irradiation was carried out from the color-converting filter section side.

With the multi-color organic light-emitting display device on which repair had been carried out, after driving it in a 1000-hour test, enlargement of dark spots with a diameter of approximately 1 mm around the repaired parts was observed, and defects sufficiently serious to be visible arose.

This application claims foreign priority benefits of Japanese patent application number JP PA 2003-271172, filed Jul. 4, 2003, the entire disclosure of which is incorporated by reference.

What is claimed is:

1. A method of repairing a short-circuited part between electrodes in a multi-color organic light-emitting display device, the method comprising the steps of:
   (1) providing a multi-color organic light-emitting display device having a color-converting filter section, and
   (2) detecting a short-circuited part between electrodes in the device, and eliminating the short-circuited part by irradiating the part with laser irradiation, wherein the laser irradiation is carried out from a side of the device on which the color-converting filter section is not present;
   wherein said detecting is performed from a side of the device on which the color-converting filter section is present.

2. The method of repairing a short-circuited part between electrodes according to claim 1, wherein multi-color organic light-emitting display device is sealed prior to use, the method further comprising carrying out the step of eliminating the short-circuited part in a vacuum or in a dry nitrogen atmosphere, prior to a sealing of the multi-color organic light-emitting display device.

3. A method of repairing a short-circuited part between electrodes in a multi-color organic light-emitting display device, the method comprising the steps of:
   providing a multi-color organic light-emitting display device having a cathode, an anode, and a color-converting filter section, the cathode, anode and color-converting section being disposed in different layers;
   disposing the multi-color organic light-emitting display device on a lighting means;
   activating the lighting means to illuminate the multi-color organic light-emitting display device;
   using a microscope to detect a short-circuited part between electrodes in the device;
   providing a positioning device, and moving the multi-color organic light-emitting display device to detect the short-circuited part between electrodes in the device; and
   eliminating the short-circuited part by irradiating the part with laser irradiation, wherein the laser irradiation is carried out from a side of the device on which the color-converting filter section is not present.

4. The method of repairing a short-circuited part between electrodes according to claim 3, wherein the microscope is an emission microscope.

5. A method of repairing a short-circuited part between electrodes In a multi-color organic light-emitting display device, the method comprising the steps at
   (1) providing a multi-color organic light-emitting display device having a cathode, an anode, and a color-converting filter section, the cathode, anode and color-converting section being disposed in different layers, with the anode being disposed between the cathode and me color-converting filter section; and
   (2) detecting a short-circuited part between electrodes in the device, and eliminating the shod-circuited part by irradiating the part with laser irradiation, wherein the laser irradiation is carded out from a direction of the cathode toward the anode, and from a side of the device on which the color-converting filter section is not present.

6. The method of repairing a short-circuited part between electrodes according to claim 5, wherein multi-color organic light-emitting display device is sealed prior to use, the method further comprising carrying out the step of eliminating the short-circuited part in a vacuum or in a dry nitrogen atmosphere, prior to a mug of the multi-color organic light-emitting display device.

7. The method of repairing a short-circuited part between electrodes according to claim 5, wherein said detecting is performed from a side of the device on which the color-converting filter section is present.

* * * * *

UNITED STATES PATENT AND TRADEMARK OFFICE
CERTIFICATE OF CORRECTION

| | | |
|---|---|---|
| PATENT NO. | : 7,141,517 B2 | Page 1 of 1 |
| APPLICATION NO. | : 10/879490 | |
| DATED | : November 28, 2006 | |
| INVENTOR(S) | : Koji Kawaguchi et al. | |

It is certified that error appears in the above-identified patent and that said Letters Patent is hereby corrected as shown below:

IN CLAIM 5:

Column 16: line 15, after "electrodes", change "In" to --in--;
line 16, after "steps", change "at" to --of--;
line 22, before "color-converting", change "me" to --the--;
line 24, after "eliminating the", change "shod-circuited" to --short-circuited--; and
line 26, after "irradiation is", change "carded" to --carried--.

IN CLAIM 6:

Column 16: line 35, after "prior to a", change "mug" to --sealing--.

Signed and Sealed this

Twentieth Day of March, 2007

JON W. DUDAS
*Director of the United States Patent and Trademark Office*